(12) United States Patent
Seeley et al.

(10) Patent No.: US 10,317,467 B2
(45) Date of Patent: Jun. 11, 2019

(54) SYNCHRONOUS MACHINE MONITORING AND DETERMINATION OF A LOSS-OF-FIELD EVENT USING TIME STAMPED ELECTRICAL AND MECHANICAL DATA

(71) Applicant: Schweitzer Engineering Laboratories, Inc., Pullman, WA (US)

(72) Inventors: Nicholas C. Seeley, Pullman, WA (US); David J. Casebolt, Moscow, ID (US); Gregary C. Zweigle, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 349 days.

(21) Appl. No.: 14/709,818

(22) Filed: May 12, 2015

(65) Prior Publication Data

US 2015/0331052 A1    Nov. 19, 2015

Related U.S. Application Data

(60) Provisional application No. 62/000,171, filed on May 19, 2014.

(51) Int. Cl.
G01R 31/34 (2006.01)
(52) U.S. Cl.
CPC ........... *G01R 31/343* (2013.01); *G01R 31/34* (2013.01)
(58) Field of Classification Search
None
See application file for complete search history.

(56) References Cited

U.S. PATENT DOCUMENTS

| | | |
|---|---|---|
| 3,921,047 A | 11/1975 | Carter |
| 4,142,591 A | 3/1979 | Himmelstein |
| 4,228,396 A | 10/1980 | Palombo |
| 4,229,694 A | 10/1980 | Wilson |
| 4,450,403 A | 5/1984 | Dreiseitl |
| 4,463,306 A | 7/1984 | de Mello |

(Continued)

FOREIGN PATENT DOCUMENTS

WO        2013184143         12/2013

OTHER PUBLICATIONS

PCT/US2015/030481 Patent Cooperation Treaty, International Search Report and Written Opinion of the International Searching Authority, dated Aug. 7, 2015.

(Continued)

*Primary Examiner* — J. H. Hur
(74) *Attorney, Agent, or Firm* — Richard M. Edge (57) ABSTRACT

Electrical power machines are monitored and a loss-of-field event is determined thereof using time stamped mechanical conditions and electrical conditions. The mechanical conditions may include rotational position, calculated and time stamped rotational frequency, valve position, temperature, or vibration. The time stamped electrical conditions may include electrical power system frequency, electrical power machine field data, electrical power machine terminal information such as voltage and current, and the like. Electrical and mechanical time-stamped electrical power machine data from different machines that may be local or remote from each other may be compared for monitoring the machines.

13 Claims, 8 Drawing Sheets

(56) References Cited

U.S. PATENT DOCUMENTS

| | | | |
|---|---|---|---|
| 4,506,339 A | 3/1985 | Kuhnlein | |
| 4,766,370 A | 8/1988 | Carr | |
| 4,991,429 A | 2/1991 | Stacey | |
| 5,537,322 A | 7/1996 | Denz | |
| 5,541,488 A | 7/1996 | Bansal | |
| 5,793,750 A | 8/1998 | Schweitzer | |
| 5,963,884 A * | 10/1999 | Billington | G21C 17/00 702/56 |
| 6,245,066 B1 | 6/2001 | Morgan | |
| 6,476,521 B1 | 11/2002 | Lof | |
| 6,642,700 B2 | 11/2003 | Slade | |
| 6,662,124 B2 | 12/2003 | Schweitzer | |
| 6,845,333 B2 | 1/2005 | Anderson | |
| 6,934,654 B2 | 8/2005 | Benmouyal | |
| 6,947,264 B2 | 9/2005 | Gill | |
| 6,947,269 B2 | 9/2005 | Lee | |
| 7,285,949 B2 | 10/2007 | Bruns | |
| 8,248,060 B2 | 8/2012 | Schweitzer | |
| 8,248,061 B2 | 8/2012 | Schweitzer | |
| 8,674,683 B2 | 3/2014 | Schweitzer, III | |
| 8,912,792 B2 | 12/2014 | Seeley | |
| 2002/0033052 A1 | 3/2002 | Kondo | |
| 2004/0126224 A1* | 7/2004 | Staroselsky | F01D 17/20 415/1 |
| 2006/0100819 A1 | 5/2006 | Grant | |
| 2007/0102935 A1* | 5/2007 | Sarlioglu | H02P 25/08 290/52 |
| 2007/0102936 A1* | 5/2007 | Sarlioglu | F01D 15/10 290/52 |
| 2009/0089608 A1 | 4/2009 | Guzman-Casillas | |
| 2009/0091303 A1 | 4/2009 | Schweitzer, III | |
| 2010/0320763 A1 | 12/2010 | Li | |
| 2011/0231171 A1 | 9/2011 | Jousselin | |
| 2011/0240628 A1 | 10/2011 | Goretti | |
| 2011/0260042 A1 | 10/2011 | Schweitzer, III | |
| 2012/0313490 A1 | 12/2012 | Schweitzer, III | |
| 2013/0049733 A1* | 2/2013 | Neti | G01R 31/343 324/71.1 |
| 2013/0088799 A1 | 4/2013 | Zeller | |
| 2014/0055126 A1 | 2/2014 | Seeley | |
| 2014/0100702 A1 | 4/2014 | Schweitzer, III et al. | |
| 2014/0111377 A1* | 4/2014 | Achanta | G01S 19/20 342/357.58 |
| 2014/0117912 A1 | 5/2014 | Gajic | |

OTHER PUBLICATIONS

Demetrios A. Tziouvaras, Daqing Hou, Schweitzer Engineering Laboratories, Inc., Out-Of-Step Protection Fundamentals and Advancements, Jan. 1, 2003.

GMM, Optical Pick-Up (OPU) Specifications & Hook-Up, Oct. 3, 1995.

Encoder Design Guide, Optical Encoder Design and Operation, Nov. 11, 2004.

Optical Encoder Design and Operation, Apr. 1, 2005.

Patent Cooperation Treaty, International Search Report PCT/2008/079228, dated Dec. 8, 2008.

Patent Coperation Treaty, Written Opinion of the International Searching Authority PCT/2008/079228, dated Dec. 8, 2008.

Stephen Petronio, Optical Rotary Encoder Basics, Design News for Mechanical and Design Engineers, Apr. 22, 2002.

Zhou Jie, Zhang Daonong, Yu Yuehai, Wu Jingtao, Zhou Ji, Bi Tianshu, Xiong Ming, Rotor Position Measurement Method for Generator Power Angles, 2011 The International Conference on Advanced Power System Automation and Protection, Oct. 16, 2011.

PCT/US2013/056271, Patent Cooperation Treaty, International Search Report and Written Opinion of the International Searching Authority, dated Feb. 10, 2014.

* cited by examiner

SYNCHRONOUS MACHINE MONITORING AND DETERMINATION OF A LOSS-OF-FIELD EVENT USING TIME STAMPED ELECTRICAL AND MECHANICAL DATA

RELATED APPLICATION

This application claims the benefit under 35 U.S.C. § 119(e) of U.S. Provisional Application No. 62/000,171, filed 19 May 2014, naming Nicholas C. Seeley, David J. Casebolt, and Gregary C. Zweigle as inventors, and titled "Electrical Generator Monitoring Using Time Stamped Electrical and Mechanical Data", which is hereby incorporated by reference herein in its entirety.

TECHNICAL FIELD

This disclosure relates to monitoring of synchronous machines such as electric power generators and synchronous motors. More particularly, this disclosure relates to monitoring of synchronous machines using mechanical and electrical conditions of the synchronous machine and the electric power delivery system. The mechanical conditions may be rotor angle, valve position, temperature, vibration, or the like.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

The stability of the power system is tied to the stability of the individual machines that make up the power system. Presently, the measure of the stability of the power system, and individual machines that comprise it, is calculated based on measured and derived values. Two values of prime importance in the consideration of system stability are the angle of a generator rotor relative to the terminal voltage and the generator field circuit quantities. By measuring these values directly the generator may be modeled. Additionally, measuring these values with precise time stamps from a common reference (using a common time such as, for example, the global positioning system (GPS), an inter-range instrumentation group (IRIG) time reference, the WWV time signal from the National Institute of Standards and Technology (NIST), the WWVB time signal from NIST, a local area network (LAN) time signal, or the like) allows direct calculation with measurements of generator and electrical network states from across a wide-area. Having these measurements available may allow monitoring of the generator, analyze the data, and use the data in more sophisticated types of machine state measurement, control and protection.

While the rotor angle is of interest for these applications, other machine quantities may be useful for the purposes of machine state and stability determination. In particular, time synchronized measurements of the synchronous machine field current and voltage may be used for monitoring. Some other measurements may include, for example, mechanical measurements such as the fuel valve position, temperature, vibration, and the like.

Combining all of the measurements together using distributed, time synchronized data acquisition modules allows for determining transient and steady state stability of a machine connected to a local or wide area power system network.

Several embodiments herein discuss monitoring of generators. It should be noted that the present application may be applied to monitoring of other synchronous machines such as synchronous motors.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

Figure 1A:
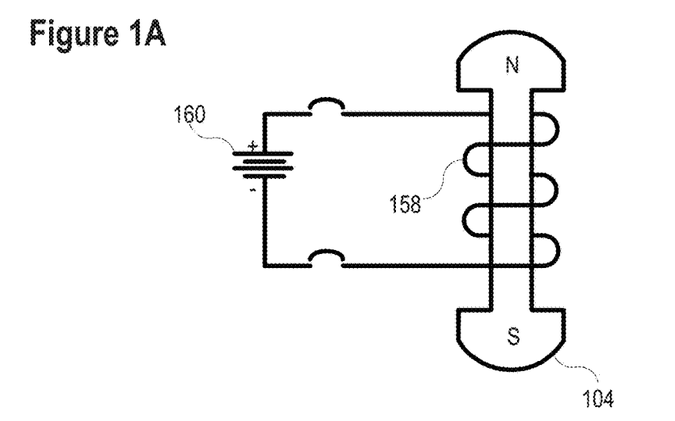
FIG. 1A illustrates a block diagram of a rotor of a synchronous generator consistent with the embodiments herein.

FIG. 1A illustrates a conceptual diagram of a rotor 104 of a synchronous generator consistent with embodiments disclosed herein. A rotor 104 may be driven by an external torque (not shown) to induce an electromagnetic field (EMF) in a stationary stator (e.g., stator 153 illustrated in FIG. 1B). The rotor 104 includes a field winding 158 wrapped around a rotor body, and the stator includes an armature winding wrapped around an armature body. A direct current is made to flow in the field winding 158 (using, for example, an exciter voltage 160) to generate a magnetic field in the rotor 104. Additionally or alternatively, permanent magnets may also be used.

Figure 1B:
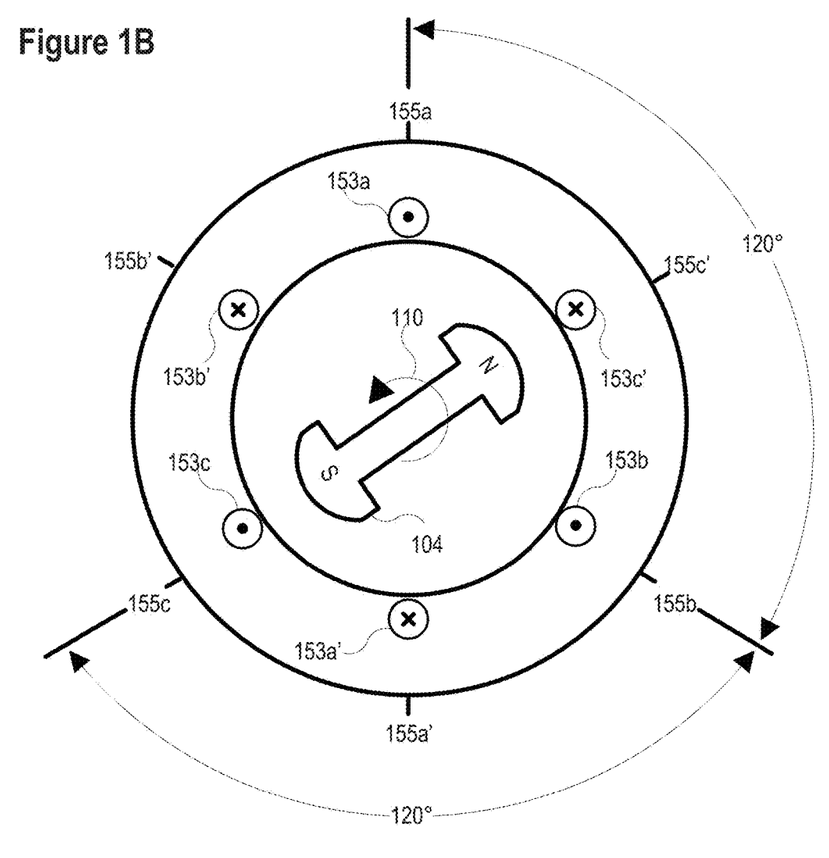
FIG. 1B illustrates a block diagram of the rotor illustrated in FIG. 1A and a stator, which together operate as a synchronous generator.

FIG. 1B illustrates a 3-phase synchronous generator that includes three sets of stator windings 153a to 153a', 153b to 153b', and 153c to 153c' consistent with embodiments disclosed herein. The stator windings are each separated by 120° such that when an electrical field associated with the rotor 104 passes, the electrical currents induced in terminal pairs 155a and 155a', 155b and 155b', and 155c and 155c' are each separated by 120 electrical degrees. When the rotor 104 rotates, as indicated by arrow 110, the magnetic field rotates with it, passing the stator windings and inducing a time-varying electric current therein. As the poles of the electrical field associated with the rotor 104 pass the stator windings, the voltage present on the corresponding terminals oscillates, and an alternating current results. Thus, the angular position of the rotor 104 is related to the time-varying electrical output of the terminals 155a-c. As described below, this relationship can be influenced by, for example, an electrical load connected to the terminals of the generator.

The period ($T_I$) of the resulting alternating current from a synchronous generator with N pole pairs, and which has a period of rotation of $T_G$, can be calculated using the formula:

Embodiments disclosed herein may be applied to any rotor regardless of the number of phases or pairs of poles included therein.

The position of the generator rotor axis is a function of a mechanical power input on the generator and an opposing electrical torque attributed to the electric output from the generator. These opposing forces result in a torque on the rotor. In a steady state condition (i.e., normal operating conditions) these forces are equal in magnitude but opposite in direction. In conditions where the mechanical torque and the electrical torque fall out of balance, the power angle may shift or oscillate, depending on the magnitude and nature of the imbalance.

Figure 2:
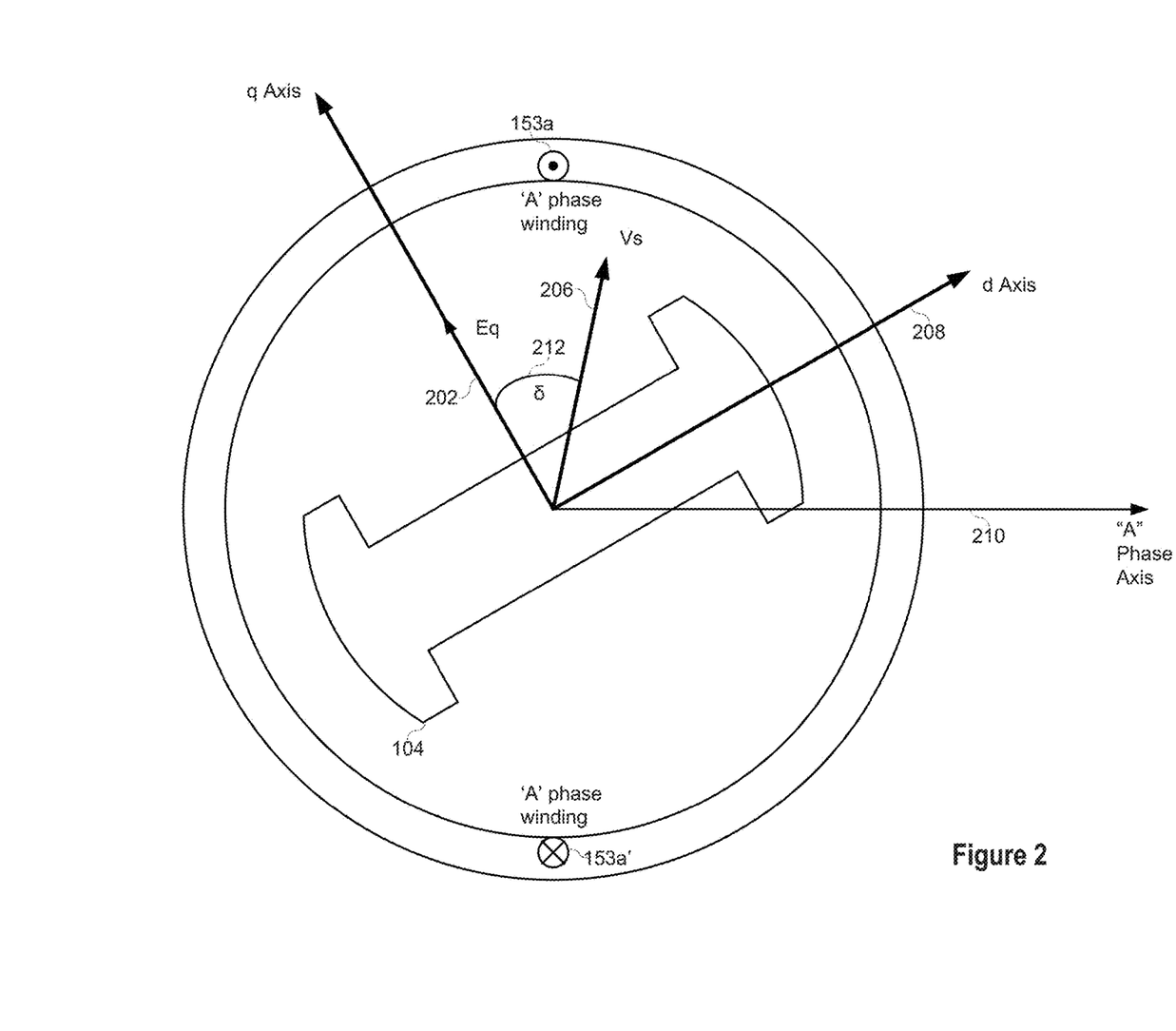
FIG. 2 illustrates a block diagram of a generator.

FIG. 2 illustrates a block diagram of a rotor and stator of an electrical generator, and is useful to illustrate calculation of certain generator information. The rotor angle (or torque angle, or load angle) δ 212 is the angle between the generator q-axis 202 and the 'A' phase of the terminal voltage 206. Also shown are the d axis 208 and the 'A' phase axis 210. This calculation of the rotor angle assumes the resistance of the stator winding to be negligible.

A synchronous generator typically employs a field control circuit which controls the strength of the magnetic flux field necessary for the production of electric power. The current through and voltage across the field circuit may be used to understand the strength of the flux linking the rotor and stator field. Time-synchronized data, as gathered herein, can be used in the determination of the steady state and transient stability of the machine, as well as calculating the internal, not directly measurable, quantities of the machine, such as the internal voltage of the machine.

Disclosed herein is a device capable of measuring the rotor angle, field quantities, and other parameters of a generator by integrating rotational positional sensors typically installed with electric power generators with an IED used to gather electrical information from the generator. The IED described herein time stamps rotor and field data and makes it available to the internal logic engine of the IED. The IED may use these data internally for generator monitoring. The IED may further pack the data into an analog variable in an IEEE C37.118 Synchrophasor message for distribution to synchrophasor data concentrator or other IEDs, or can be used with any other data protocol.

Figure 3:
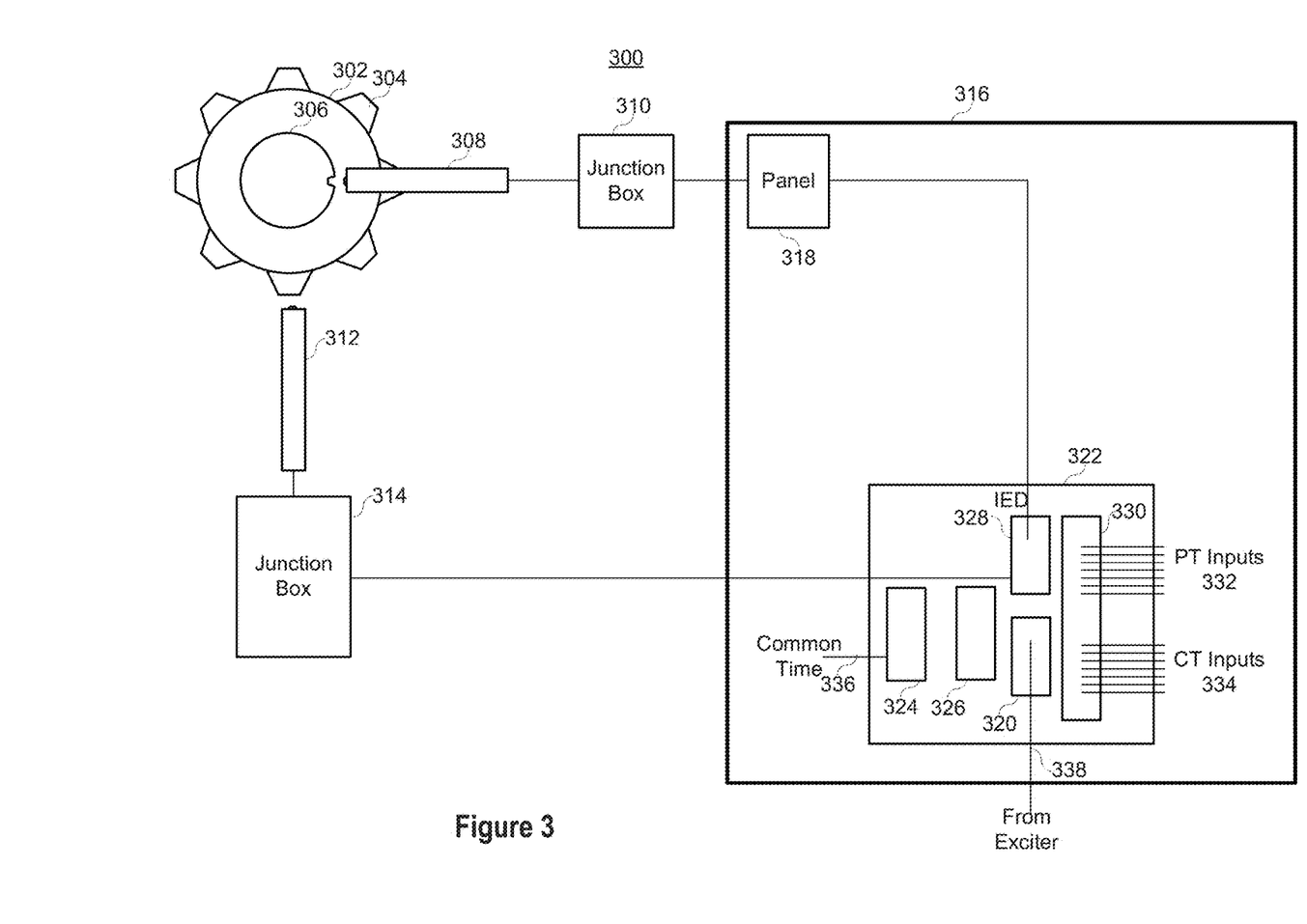
FIG. 3 illustrates a block diagram of a system for monitoring mechanical and electrical properties of a synchronous machine.

FIG. 3 illustrates a block diagram of a system 300 for monitoring an electric power generator. The system 300 includes a first mechanical rotor position sensor 308 in communication with the generator rotor or indicator 306 that rotates with the rotor of the generator. The sensor 308 may detect rotations of the rotor and provide a pulse or other signal. The signal may be transmitted to the IED 322 via a junction box 310, and panel 318 of a control enclosure 316. The system 300 may include a second mechanical rotor position sensor 312 in communication with a toothed wheel 302 that includes a number of teeth 304. The passing of the plurality of teeth 304 in proximity to sensor 312 causes a distortion of the magnetic flux field passing through the sensing coil of the sensor 312, which in turn generates a signal voltage. In certain embodiments, tooth wheel 302 may be formed of ferrous material. The voltage induced in sensing coil is proportional to the rate of change of flux in the magnetic field, where the rate of change of flux is determined by the size of the air gap, and the rotational velocity of the tooth wheel 302, as provided in Eq. 2.

$$T_I = \frac{T_G}{N} \qquad \text{Eq. 1}$$

$$\varepsilon = -N\frac{d\Phi}{dt} \qquad \text{Eq. 2}$$

In Eq. 2, ε represents the voltage induced in the sensing coil, N represents the number of coil turns in the sensing coil, and Φ represents the flux in the magnetic field generated by permanent magnet. A plurality of leads may be used to transmit the signal generated by MPU 400 to an IED or other device. The frequency of the induced voltage is proportional to the number of teeth on the wheel and the speed of rotation, according to Eq. 3.

$$\text{Frequency(Hz)} = \frac{\text{Number of Teeth} * \text{RPM}}{60} \qquad \text{Eq. 3}$$

The signal from the second sensor 312 may be transmitted to the IED via, for example, a junction box 314. IED may be configured to perform calculations such as those above, to calculate a rotational frequency of the generator rotor.

Generally, the control enclosure 316 includes an IED 322 for performing the methods herein. In some embodiments, the control enclosure 316 may include further hardware used for providing appropriate signals to the IED 322. The IED 322 includes a common time input for receiving a common time 336 as described above. IED 322 may also include an automation controller 326 for receiving, for example, certain information from an exciter of the generator. IED may also include an analog input module 328 receiving information from any of the first sensor 308 and the second sensor 312. IED 322 may further include a CT/PT module 330 for receiving inputs from current transformer(s) ("CTs") and potential transformer(s) ("PTs"). CT/PT module may include PT inputs 332 and CT inputs 334.

The IED analog input card 328 accepts the rotor sensor signals and performs the required time stamping using time information from the common time reference 336. The IED receives the rotational position signal(s) from any of the first (rotor keyphasor) sensor and the second (tooth wheel) sensor and time stamps the signal rising edges. These time stamps are then be available in the automation controller module 326, which may include a logic engine for internal logic calculations or for mapping to protocols for data concentration.

The time stamps may be used to calculate the rotational velocity and relative phase angle of the rotor. Care must be taken in identifying the number of poles of the machine, as the number of poles dictates the nameplate rotational velocity. The formula below defines the relationship between the number of poles of the machine and its mechanical speed.

$$\text{RPM} = \frac{120 * \text{Electrical Frequency}}{\text{Number of Poles}} \qquad \text{Eq. 4}$$

This relationship may be a factor in relating the electrical speed of the machine to the mechanical speed of the machine. Additionally, this relationship must be considered when using the time-stamped pulses to calculate the relative angle of the rotor.

Rotational velocity may be calculated on a real time basis using information available within the device such as, for example, time stamped rotor angle, time stamped rotor position, common time reference, and the like. Rotational velocity may further be used by the device to monitor the electrical generator. For example, the device may be configured to extract modal components from the rotational velocity, which may be used to detect resonance conditions of the electric power delivery system.

The field voltage and current may be measured, but may require level conversion from their raw state to a range acceptable to the IED 322. An appropriate voltage divider may be used to interface the signals to the IED. The field quantities are normally monitored by the excitation controller and are available in the exciter controller cabinet. For example, an exciter controller may be used to make the field quantities 338 available to the IED 322 via an analog input module 320. Field quantities 338 may be obtained from the exciter controller using a voltage divider (not separately illustrated) to reduce the high voltage field circuit to a level acceptable to the IED. A shunt resistor may be installed in series with the field circuit that produces, for example, a 100 mV drop across the resistor when the field is excited to its nameplate value. This voltage magnitude is proportional to the field current. The voltage is an input to the analog input card 328 of the IED 322 and is available internally to the logic engine. Further field I/O modules or field voltage and current modules may be used for obtaining, routing, and conditioning of the field quantities before they are transmitted to the analog input card 320 of the IED 322.

Time may be distributed with further IEDs using the common time source over any of a number of protocols and physical media.

Figure 4:
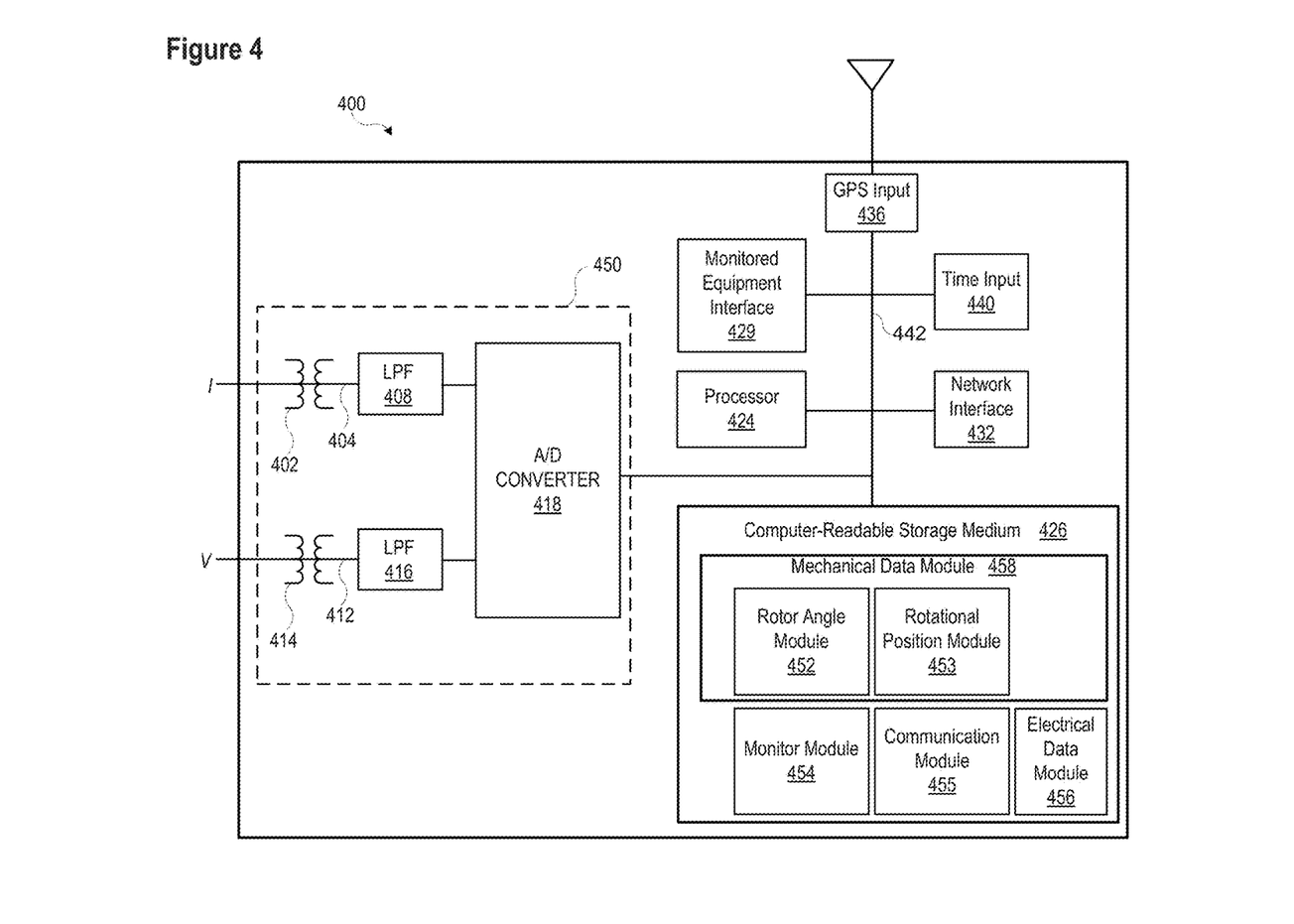
FIG. 4 illustrates a block diagram of an intelligent electronic device ("IED") configured to operate according to the embodiments herein.

FIG. 4 illustrates an exemplary block diagram of an IED 400 configured to monitor an electrical generator consistent with embodiments disclosed herein. IED 400 includes a network interface 432 configured to communicate with a data network. IED 400 also includes a time input 440, which may be used to receive a time signal. In certain embodiments, time input 440 may be used to generate a reference signal, as described above. In certain embodiments, a common time reference may be received via network interface 432, and accordingly, a separate time input and/or GPS input 436 would not be necessary. One such embodiment may employ the IEEE 1588 protocol. Alternatively, a GPS input 436 may be provided in addition or instead of a time input 440.

A monitored equipment interface 429 may be configured to receive status information from, and issue control instructions to a piece of monitored equipment, such as an electrical generator. According to certain embodiments, the monitored equipment interface 429 may be configured to interface with an MPU and/or Hall-Effect sensor that generates a signal based upon the detection of the passage of one or more teeth associated with a tooth wheel coupled to a rotor in an electrical generator.

A computer-readable storage medium 426 may be the repository of one or more modules and/or executable instructions configured to implement any of the processes described herein. A data bus 442 may link monitored equipment interface 429, time input 440, network interface 432, GPS input 436, and computer-readable storage medium 426 to a processor 424.

Processor 424 may be configured to process communications received via network interface 432, time input 440, GPS input 436, and monitored equipment interface 429. Processor 424 may operate using any number of processing rates and architectures. Processor 424 may be configured to perform various algorithms and calculations described herein using computer executable instructions stored on computer-readable storage medium 426. Processor 424 may be embodied as a general purpose integrated circuit, an application specific integrated circuit, a field-programmable gate array, and other programmable logic devices.

In certain embodiments, IED 400 may include a sensor component 450. In the illustrated embodiment, sensor component 450 is configured to gather data directly from a conductor (not shown) using a current transformer 402 and/or a voltage transformer 414. Voltage transformer 414 may be configured to step-down the power system's voltage (V) to a secondary voltage waveform 412 having a magnitude that can be readily monitored and measured by IED 400. Similarly, current transformer 402 may be configured to proportionally step-down the power system's line current (I) to a secondary current waveform 404 having a magnitude that can be readily monitored and measured by IED 400. Low pass filters 408, 416 respectively filter the secondary current waveform 404 and the secondary voltage waveform 412. An analog-to-digital converter 418 may multiplex, sample and/or digitize the filtered waveforms to form corresponding digitized current and voltage signals.

As described above, certain embodiments may monitor the terminal voltage of one or more phases of electrical power generated by an electrical generator. Sensor component 450 may be configured to perform this task. Further, sensor component 450 may be configured to monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, and the like.

A/D converter 418 may be connected to processor 424 by way of a bus 442, through which digitized representations of current and voltage signals may be transmitted to processor 424. In various embodiments, the digitized current and voltage signals may be compared against conditions. For example, certain conditions may be established in order to implement one or more control actions based upon a determination that a power angle exceeds a threshold. The control action may include an instruction to reduce the load connected to the generator (e.g., by load shedding) or an instruction to increase generation capacity.

A monitored equipment interface 429 may be configured to receive status information from, and issue control instructions to a piece of monitored equipment. As discussed above, control actions may be issued when the power angle of a generator is outside of an acceptable range in order to cause the power angle to return to the acceptable range. Monitored equipment interface 429 may be configured to issue control instructions to one or more pieces of monitored equipment. According to some embodiments, control instructions may also be issued via network interface 432. Control instructions issued via network interface 432 may be transmitted, for example, to other IEDs (not shown), which in turn may issue the control instruction to a piece of monitored equipment. Alternatively, the piece of monitored equipment may receive the control instruction directly via its own network interface.

Computer-readable storage medium 426 may be the repository of one or more modules and/or executable instructions configured to implement certain functions described herein. The mechanical data module 458 may be configured to determine various operating parameters of certain mechanical data obtained from the synchronous machine. For example, the mechanical data module may include a rotational position module 453, configured to determine the rotational position of the rotor based upon the relative shift between the reference signal and the rotational position signal. Further, the rotational position module 453 may be configured to determine whether the rotational position is within an acceptable range. The mechanical data module 458 may further include a rotor angle module 452 configured to calculate and time stamp a rotor angle using the common time and a signal from the rotor position sensors. The determination of whether the rotational position is within an acceptable range may be used to determine when control actions are to be implemented in order to cause the rotational position to return to the acceptable range. The mechanical data module 458 may further receive signals related to other mechanical operations of the synchronous machine such as, for example, valve positions, temperatures, and the like. The mechanical data module 458 may be configured to obtain such measurements, apply time stamps, determine baseline conditions (or the monitor module 454 may receive such information and determine baseline conditions), and the like.

Monitor module 454 may be configured to receive electrical and mechanical data from the mechanical data module and electrical data module 456, and perform monitoring functions such as comparisons and display of such data once the data has been time aligned using the time stamps associated therewith. Monitor module 454 may further be configured to issue appropriate control instructions in order to maintain the electrical generator within an acceptable range, within steady state, or to cause the rotational position to return to the acceptable range. Communication module 455 may facilitate communication between IED 400 and other IEDs (not shown) via network interface 432. In addition, communication module 455 may further facilitate communication with monitored equipment in communication with IED 400 via monitored equipment interface 429 or with monitored equipment in communication with IED 400 via network interface 432. Finally, electrical data module 456 may be configured to compute and time-stamp field data.

Figure 5:
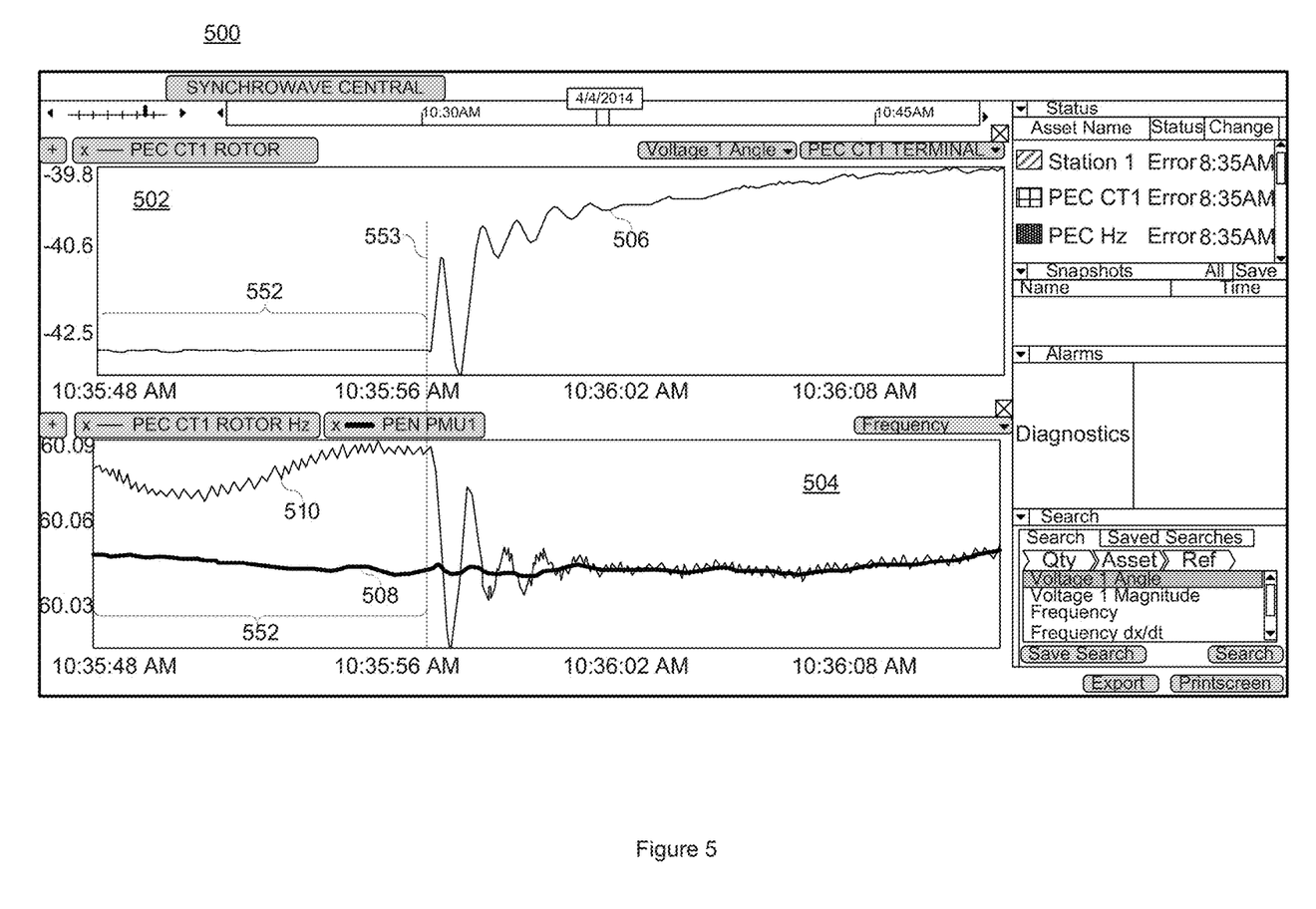
FIG. 5 illustrates an example of a display of electrical and mechanical synchronous machine information useful for monitoring a synchronous machine.

Turning back to the monitoring module 454, following are some examples of monitoring that may be performed. A simple and common embodiment of the system described above may provide data to an operator for visualization and system awareness. FIG. 5 illustrates a screen capture 500 of an output from the monitoring module 454 according to several embodiments herein. Monitoring module 454 may be configured to output graphical representations of the data and determinations of the IED 400 to a human-machine interface. The human-machine interface may be configured to accept user inputs and selections to determine the information that is displayed.

Screen capture 500 of FIG. 5 illustrates information that may be gathered and generated therefrom using certain embodiments described herein. Plots 502 and 504 illustrate data collected from a power system during a synchronization event. Plot 502 shows a trace 506 of an angle of a rotor of a generator relative to the generator terminal voltage during a selected period of time. Plot 504 illustrates a trace 508 of the frequency of the power system and a trace 510 of the mechanical frequency of the rotor of the generator during the same time period as that in plot 502. As can be seen, during time period 552 the rotor is not synchronized to the electric power system and the rotor is spinning faster than the electric power system frequency. At time 553 a synchronization breaker is closed, connecting the electric generator to the electric power system. After time 553, the angle of the rotor relative to the generator terminal voltage 506 oscillates, and then increases to a steady state. Further, the mechanical frequency of the rotor of the generator oscillates and then approaches a steady state corresponding with the electrical frequency of the electric power system.

Figure 6:
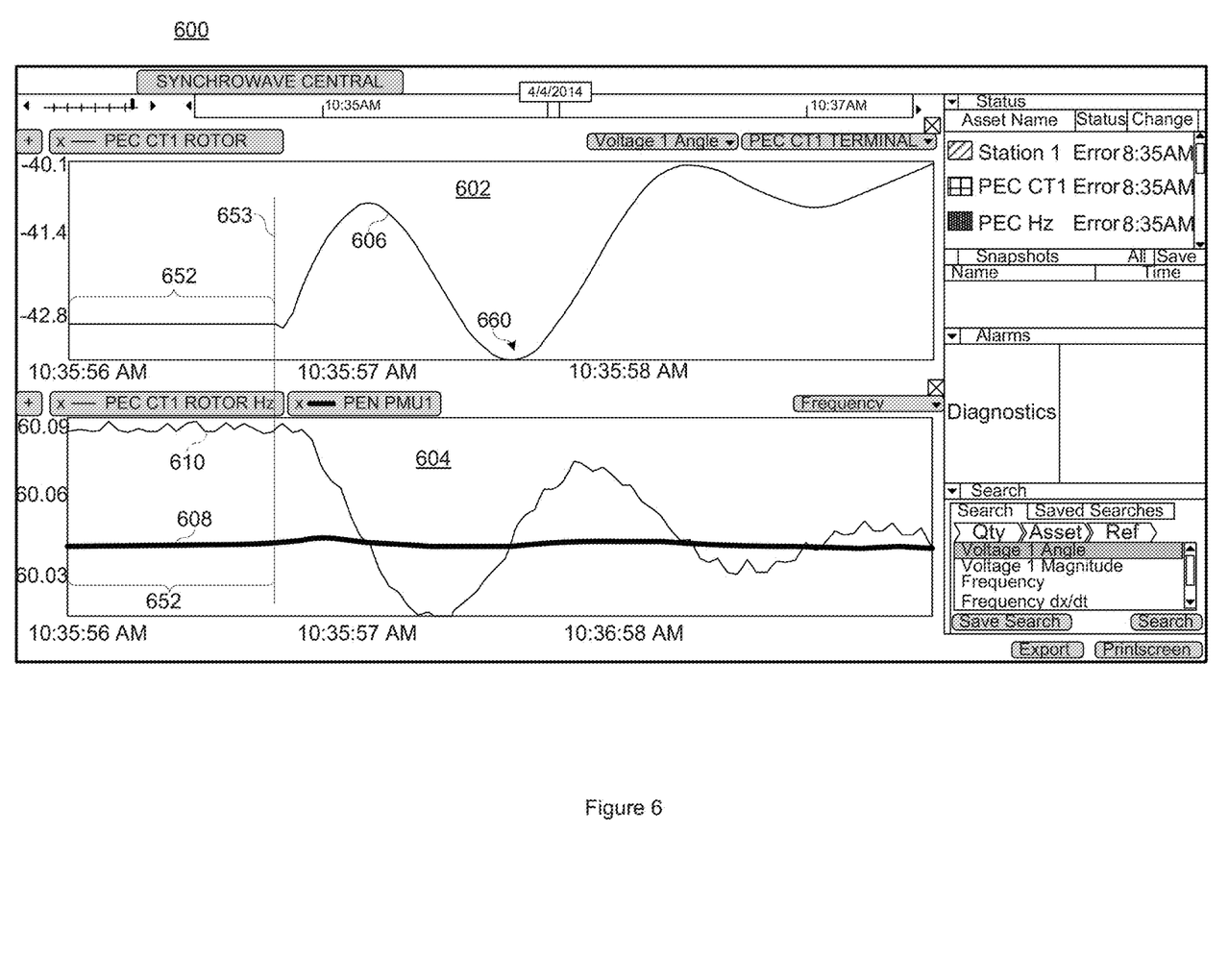
FIG. 6 illustrates another example of a display of electrical and mechanical synchronous machine information useful for monitoring a synchronous machine.

FIG. 6 illustrates another screen capture 600 of an output from the monitoring module 454 according to several embodiments herein. The plots 602 and 604 of screen capture 600 are taken during a synchronization event where the generator that is being connected to the electric power delivery system momentarily enters a motoring, or reverse power condition. Plot 602 illustrates a trace 606 of an angle of a rotor of the generator relative to the generator terminal voltage during a selected period of time. Plot 604 illustrates a trace 508 of the frequency of the power system and a trace 510 of the mechanical frequency of the rotor of the generator during the same time period as that in plot 502. As can be seen, during time period 652 the rotor is not synchronized to the electric power system and the rotor is spinning faster than the electric power system frequency. At time 653 a synchronization breaker is closed, connecting the electric generator to the electric power system. After time 653, the angle of the rotor relative to the generator terminal voltage 606 oscillates, and then increases to a steady state. Further, the mechanical frequency of the rotor of the generator oscillates and then approaches a steady state corresponding with the electrical frequency of the electric power system.

Further, it can be seen that at during period 660 the rotor angle of the electric generator decreases below the initial offset during time period 652. Thus, it can be seen that during period 660 the generator experiences a reverse power or motoring condition, where the generator is acting as a motor by absorbing power. Prime mover driven generators are not necessarily designed to operate as a motor, or in reverse power conditions, and as such, the condition where a generator begins to motor is important to detect. Accordingly, the embodiments herein may be used to detect and to visualize a reverse power or motoring condition on an electric generator.

Generators may be modeled numerically using what is known as a rotating reference frame. The rotating reference frame is commonly called the "Park's Transformation" and is a set of equations that reduces a three phase set of sinusoidal measurements to two values that are non-sinusoidally varying (constant DC values) in steady state. The purpose of this transformation in machine analysis is to remove the relationship of inductances to the angular position of the rotor. Using the rotor angle that is available from the rotor angle module, dq values (such as, for example, dq current, dq voltage, dq impedance, and the like) may be calculated in real time, displayed in real time, and used for monitoring of the generator. Such monitoring of the generator may include determination of steady state, determination of loss of field, and the like. Furthermore, dq values may be used in control of the generator in the event of a loss of field event, or a condition outside of steady state occurs. Equation 5 may be used to calculate dq values:

$$\begin{bmatrix} f_0 \\ f_d \\ f_q \end{bmatrix} = 2/3 \begin{bmatrix} \frac{1}{2} & \frac{1}{2} & \frac{1}{2} \\ \cos\theta & \cos\left(\theta - \frac{2\pi}{3}\right) & \cos\left(\theta + \frac{2\pi}{3}\right) \\ \sin\theta & \sin\left(\theta - \frac{2\pi}{3}\right) & \sin\left(\theta + \frac{2\pi}{3}\right) \end{bmatrix} \begin{bmatrix} f_a \\ f_b \\ f_c \end{bmatrix} \quad \text{Eq. 5}$$

With the measurement of the rotor angle of the machine obtained using the embodiments herein, it is possible to determine dq voltages, impedances, and currents of the generator. The combination of the dq quantities of the machine and the rotor angle allows for a novel method of protecting the machine. For example, a Loss of Field (LOF) detection and protection strategy could be employed.

LOF detection is traditionally accomplished by taking voltage and current measurements to calculate impedance. A loss of field event is characterized by a very specific change in impedance. Alternatively, LOF can be detected by using the rotor angle in conjunction with the calculated dq current quantities. The plots 700 and 800 of FIGS. 7 and 8, respectively, show the results of an LOF event.

Figure 7:
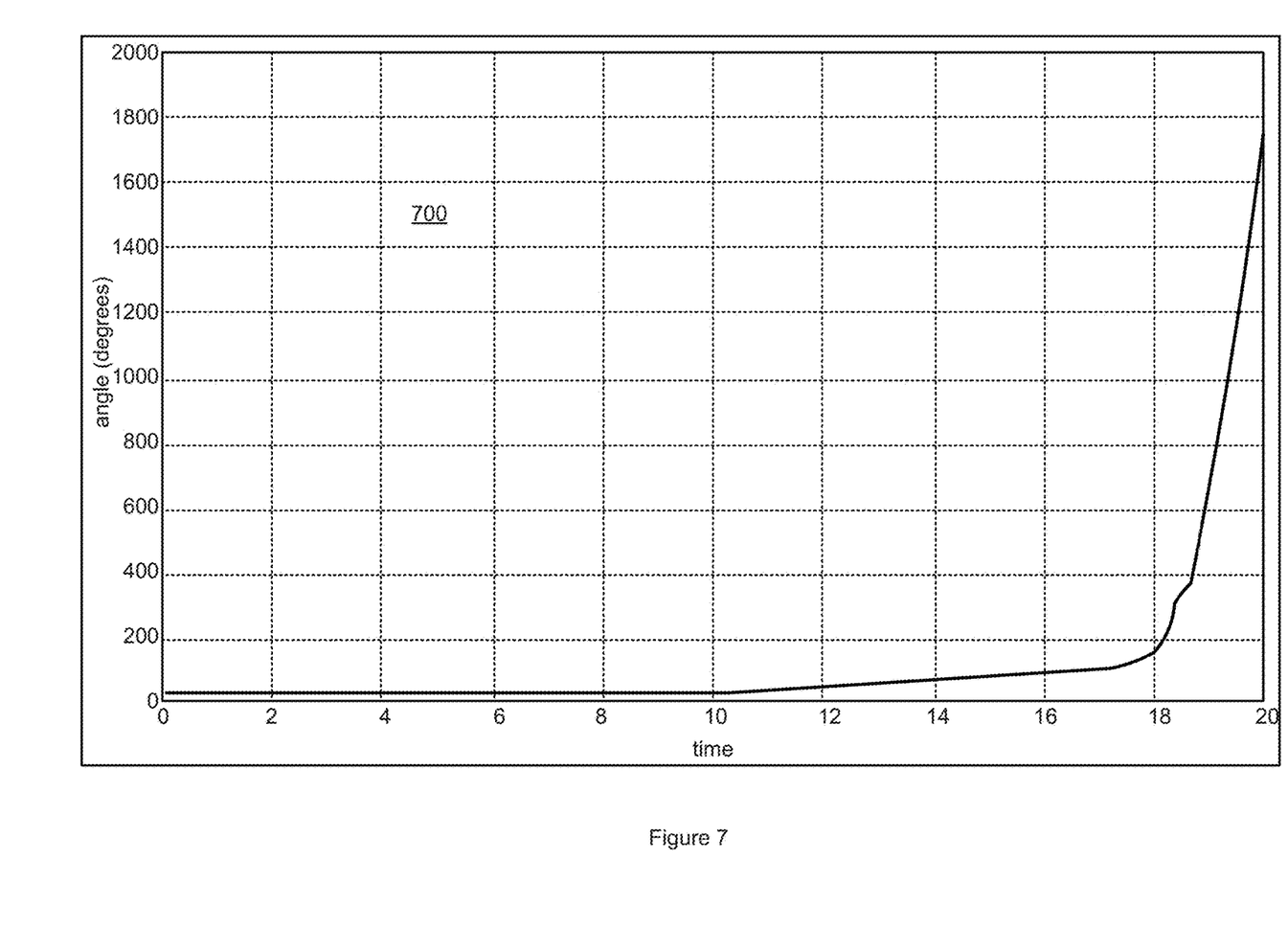
FIG. 7 illustrates another example of a display of electrical and mechanical synchronous machine information useful for monitoring a synchronous machine.

FIG. 7 illustrates a plot 700 of a rotor angle over a period of time. At t=10 seconds, the field voltage drops to zero. The rotor angle gradually increases as the magnetic link between the rotor field and stator field diminishes. This angular separation occurs because the prime mover driving the rotor maintains a fixed torque, yet the link coupling the stator and rotor fields is decaying. The result is that the rotor begins to separate from the stator until synchronism is completely lost. Thus, a LOF condition may be detected visualized using the embodiments herein.

Rotor angle alone cannot be used to determine a LOF event because it cannot determine what a normal load increase versus a LOF event is. Therefore, dq current, calculated in real time as described above, can be used to supplement the rotor angle measurement.

Figure 8:
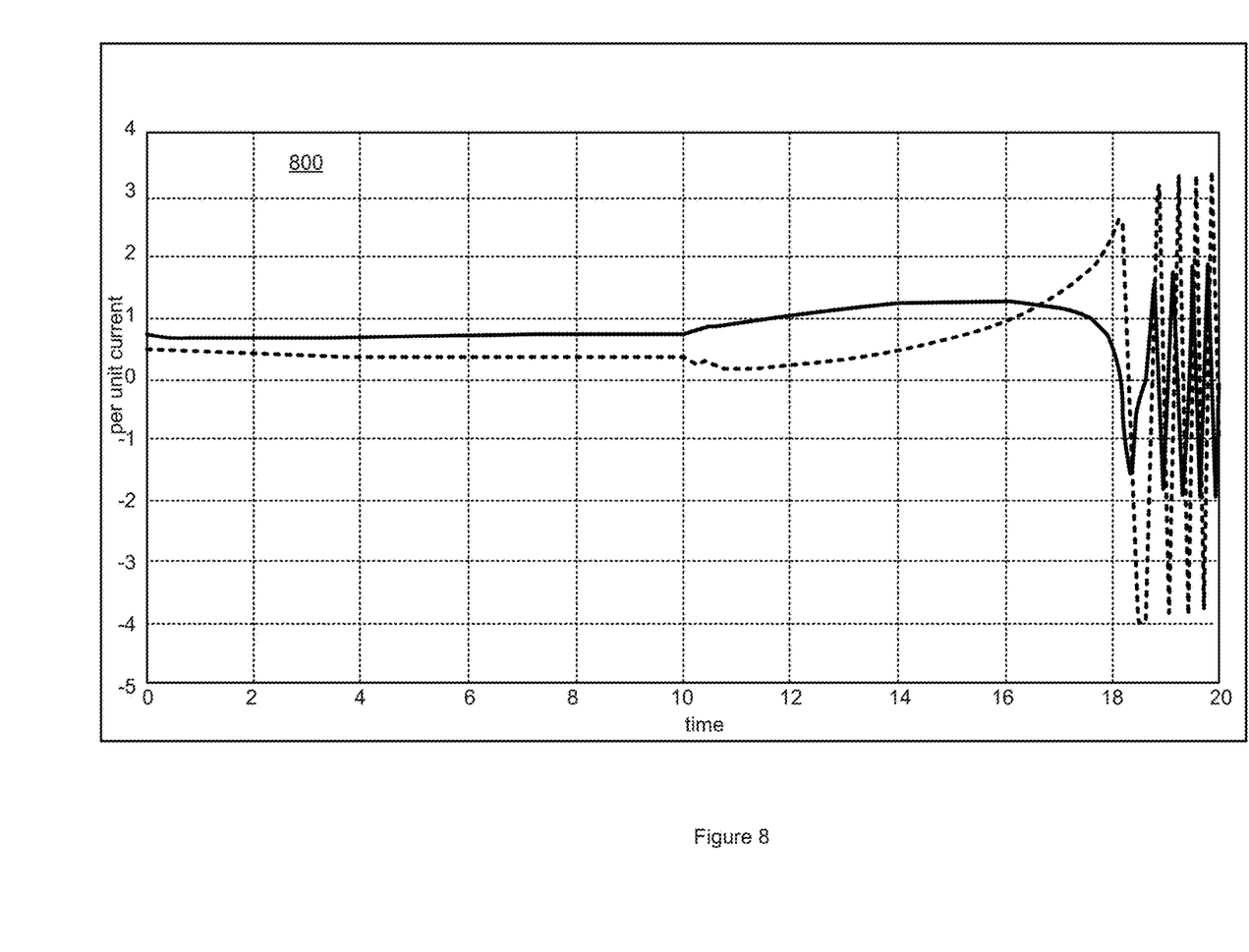
FIG. 8 illustrates yet another example of a display of electrical and mechanical synchronous machine information useful for monitoring a synchronous machine.

FIG. 8 illustrates a plot 800 of dq currents in per-unit over time during a LOF event. Again, at time t=10 seconds, the field voltage drops to zero. During a LOF event, the dq currents begin to change. This characteristic is specific to a reduction in output of reactive power. Using the rotor angle together with the dq currents as described herein may be used to detect and visualize a LOF event.

In one particular embodiment, a system including multiple synchronous machines may be monitored to detect LOF events. In such a system, the rotor angles and dq currents amongst the synchronous machines could be monitored such that when a rotor of a particular machine advances and the dq currents of the particular machine show characteristics similar to those illustrated in FIG. 8, while the rotor angles and dq currents of the remaining synchronous machines remain relatively static, a LOF event on the particular machine may be detected. In certain embodiments, use of dq quantities for protection requires the rotor angle measurement.

The combined time synchronized measurements taken from the distributed data acquisition nodes and controllers may be used to numerically model machines or controllers. The time synchronized nature of the measurements may be used for developing mathematical models of complex systems. Generators possess parameters that are typically only active and have an impact on the system under certain conditions. In particular these parameters are referred to as subtransient, transient and steady state. These parameters are typically only active in affecting the system for a finite period of time during any given power system event. During a power system event all generator and controller parameters are involved in producing resulting system response. Collection and calculation of these data during transient conditions allows us to revels the true parameters of the system.

Controllers have similar parameters that determine the amount of time a controller action requires to obtain an observable change in the controlled system. Time synchronized, distributed data collection methods such as those described herein may allow measurements to be combined to produce a detailed model of how the controller impacts the output of the system.

In one particular embodiment, a condition of a synchronous machine may be monitored using baseline conditions of the particular machine calculated during successful operation of the particular machine. Using the embodiments herein, several operating parameters of a particular synchronous machine are obtained and monitored by an IED such as IED 400 of FIG. 4. IED 400 may establish a baseline operating parameter from the monitored operating parameters of the synchronous machine. IED may then either calculate or use preset margins for the operating parameter. IED 400 continues monitoring the operating parameter of the synchronous machine and compare the present value of the operating parameter against the baseline value with its margins. If the operating parameter exceeds the baseline value with its margins, the IED may detect an event. The monitor module 454 of IED 400 may include computer instructions for establishing a baseline from operating parameters and comparing the present value of the operating parameter against the baseline as described herein.

In one embodiment, the baseline may be a rotor angle of a synchronous generator. IED 400 may be preset with margins of from around 0.1° to around 10°, or more particularly to around 5° of baseline for the operating parameter of rotor angle. IED may be customizable by a user to adjust the margins of the baseline rotor angle. After startup of the monitored generator, IED 400 may monitor the rotor angle and establish a baseline thereof. The baseline may be a moving average. For example, the baseline may be a moving average for from around 1 second to around 30 seconds. In one embodiment, the moving average may be around 3 seconds. Once the rotor angle exceeds the baseline plus-or-minus the margin, then an event such as a loss-of-field event may be detected by the IED.

In another embodiment, IED 400 may monitor the dq currents of the generator, as illustrated in FIG. 8. IED 400 may be configured to calculate an average difference between the d and q currents, and apply a predetermined or user preset margin. For example, the IED 400 may be configured to calculate a moving average of a difference between per-unit d and q currents. The IED may then compare a present difference between d and q currents against the moving average plus the margin. If the present difference is greater than the moving average plus the margin, then the IED 400 may indicate an event such as a loss-of-field event. Thus, the IED 400 may be configured to calculate a baseline of an operating parameter of the synchronous machine and compare present operating parameters against the baseline to detect an operating event of the synchronous machine.

For example, an IED 400 in monitoring the dq currents illustrated in FIG. 8 may establish a baseline difference using the first 10 seconds of the data that is shown. The baseline difference may be determined using past data during successful operation or operation without event. The IED may determine that the baseline difference is around 0.25 per unit current. The IED may include a predetermined margin for dq current difference. The predetermined margin may be the baseline plus around 0.50 per unit current. At time t=12 seconds, which is 2 seconds after the event, the difference in dq current reaches around 0.80, which is greater than the baseline difference current plus the margin. Thus, the IED 400 may establish a baseline and compare the present values against the baseline plus a margin to detect an operating event of the synchronous machine.

As it is disclosed herein to obtain several operating parameters from a synchronous machine, including, for example, dq currents, rotor angle, power angle, voltage, valve positions, temperatures, and the like. In one particular embodiment, a valve position is monitored by IED 400. The control algorithm of the IED may include a time constant associated with the valve that relates to the time it takes for the valve to reach a given position (percent open or closed). The reaction of the valve position to control inputs may be monitored and by the IED. The IED further establishes a baseline corresponding to how the valve position changes for upon certain control inputs. Once the baseline is established, the IED 400 monitors the valve and compares how the valve position changes in response to particular control inputs, and compares that against the established baseline. If the valve position does not change in accordance with the established baseline, then the IED may output an alarm indicating such. Failure of the valve to operate in accordance with its established baseline may indicate a problem with the valve, the controller, or the like.

In another embodiment, the IED 400 may be configured to monitor a temperature of the synchronous machine. The temperature may be monitored during certain control inputs to the synchronous machine, and baselines established for the temperature and how the temperature changes during certain operations of the synchronous machine resulting from certain control inputs. Once the baseline conditions are established, the temperature of the synchronous machine is monitored against the baseline during similar operations of the synchronous machine. If the temperature or the change in temperature differs from the established baselines by more than a predetermined margin, the IED may so indicate using an alarm or the like.

IEDs may be configured to obtain measurements of a number of parameters of the synchronous machine. For example, IEDs such as IED 400 may be configured to obtain filed voltage, terminal voltage (such as, for example, dq quantities), rotor angle, and terminal current (for example, in dq quantities). Each of these measurements may be obtained during normal operation of the synchronous machine, and baselines of each may be established by the IED. Once the baselines are established, the present values of these monitored parameters may be compared against the baselines. If the present values differ from the baseline by more than a predetermined margin, then the IED may so indicate using an alarm.

In certain embodiments, the baselines may be dynamic in that they change as the synchronous machine successfully operates. The change in the baseline over time may also be monitored. For example, the present baseline may be compared against a previously established baseline. When the present baseline has changed from the previous baseline by more than a predetermined amount, then the IED may so indicate in an alarm. An operator may then determine a state of the synchronous machine using the change in baseline.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. An intelligent electronic device ("IED") for monitoring a synchronous electrical power machine, comprising:
   a time input in communication with a common time reference;
   a mechanical data input in communication with the electrical power machine for providing a rotor position signal from the electrical power machine to the IED;
   an electrical data input for receiving electrical power machine electrical data, comprising:

a field data input in communication with an exciter of the electrical power machine providing field current signals from the electrical power machine; and, a monitoring module in communication with the time input, the mechanical data input, and the electrical data input, and configured to:

calculate rotor angles of the synchronous electrical power machine using the rotor position signal;

calculate a transformation of the field current signals to a rotating reference frame using the rotor angles of the synchronous electrical power machine to form dq currents;

during a successful operation of the electrical power machine without event, calculate a dq current baseline from the calculated dq currents during the successful operation;

following the successful operation of the synchronous electrical power machine:

calculate a present dq current of the synchronous electrical power machine using the rotor angles and the field current signals;

compare the present dq current with the baseline; and signal an alarm when the present dq current differs from the baseline by more than a predetermined threshold.

2. An intelligent electronic device ("IED") comprising:

a time input in communication with a common time reference;

a machine mechanical data input in communication with an electrical machine for providing a rotor position signal from the electrical machine;

a field data input in communication with an exciter of the electrical machine providing field current signals from the electrical machine;

a mechanical data module in communication with the time input and the machine mechanical data input for calculating rotor angles of a rotor of the electrical machine and time stamping the rotor angles using a time signal from the time input;

a field data module in communication with the field data input and the time input for calculating a transformation of the field current signals to a rotating reference frame using the rotor angles of the electrical machine to form dq currents, and time stamping the dq currents using the time signal from the time input; and, a monitoring module in communication with the field data module and the mechanical data module, configured to determine a successful operation of the electrical machine as operation of the electrical machine without event for a predetermined time;

calculate a dq current baseline from the calculated dq currents during the successful operation of the electrical machine;

following the successful operation of the electrical machine:

calculating a present dq current of the electrical machine from the rotor angles and the field current signals;

comparing the present dq current against the calculated dq current baseline; and, when the calculated dq current is outside of the dq current baseline, determine a loss-of-field event of the electrical machine.

3. The intelligent electronic device of claim 2, wherein the monitoring module is configured to determine whether the present dq current of the electric machine is outside of the dq current baseline by more than a predetermined margin.

4. The intelligent electronic device of claim 2, wherein the monitoring module is further configured to store the dq current baseline.

5. The intelligent electronic device of claim 4, wherein the monitoring module is further configured to compare a present dq current baseline with a past dq current baseline.

6. The intelligent electronic device of claim 5, wherein the monitoring module is further configured to assert an alarm when a difference between the present dq current baseline and the past dq current baseline exceeds a predetermined threshold.

7. The intelligent electronic device of claim 2, wherein the electrical machine comprises a synchronous generator.

8. The intelligent electronic device of claim 2, wherein the electrical machine comprises a synchronous motor.

9. A method for monitoring an electrical power machine, comprising:

an intelligent electronic device ("IED") measuring a rotor position of the electrical power machine and calculating a rotor angle of the electrical power machine using the measured rotor position;

the IED measuring field data from a field data input in communication with an exciter of the electrical power machine and calculating a field current of the electrical power machine using the field data;

calculating a transformation of the field current to a rotating reference frame using the rotor angles of the electrical power machine during a successful operation of the electrical power machine without event to form a dq current baseline of the electrical power machine;

calculating a transformation of the field current to a rotating reference frame using the rotor angles of the electrical power machine following the calculation of the dq current baseline to form a present dq current of the electrical power machine; and determining a loss-of-field event of the electrical power machine when a difference between the present dq current and the baseline dq current exceeds a predetermined margin.

10. The method of claim 9, further comprising the step of comparing a present dq current baseline against a past dq current baseline.

11. The method of claim 10, further comprising the step of asserting an alarm when a difference between the present dq current baseline and the past dq current baseline exceeds a predetermined threshold.

12. The method of claim 9, wherein the electric power machine comprises a synchronous generator.

13. The method of claim 9, wherein the electric power machine comprises a synchronous motor.

* * * * *